United States Patent [19]

Brewer

[11] 4,061,799
[45] Dec. 6, 1977

[54] METHOD OF PATTERNING STYRENE DIENE BLOCK COPOLYMER ELECTRON BEAM RESISTS

[75] Inventor: Terry L. Brewer, Plano, Tex.

[73] Assignee: Texas Instruments Incorporated, Dallas, Tex.

[21] Appl. No.: 615,447

[22] Filed: Sept. 22, 1975

Related U.S. Application Data

[63] Continuation-in-part of Ser. No. 412,930, Nov. 5, 1973, abandoned.

[51] Int. Cl.$^2$ .................... B44C 1/22; C03C 15/00; B05D 3/06
[52] U.S. Cl. .................................. 427/43; 156/643; 156/659; 427/273
[58] Field of Search ............. 96/27 E, 32, 35.1, 86 R, 96/115 R, 115 P; 427/43, 56, 272, 287, 273, 385; 156/2, 8, 13, 18, 643, 658, 659, 668; 204/159.11, 159.22

[56] References Cited

U.S. PATENT DOCUMENTS 3,674,486   7/1972   Milgrom .............................. 96/35.1
3,794,510   2/1974   Scala et al. ............................ 427/43

Primary Examiner—William A. Powell
Attorney, Agent, or Firm—James T. Comfort; Gary C. Honeycutt

[57] ABSTRACT

Disclosed is a method of forming patterned electron beam resists from styrene-diene block copolymers and the resists formed thereby. A thin film of a styrene-diene block copolymer is applied to a support and is subjected to an electron beam scan. An electron beam irradiates a portion of the copolymer film according to a programmed pattern; the copolymer cross links where irradiated, thus causing the irradiated portion of the copolymer to become insoluble in a solvent. The balance of the copolymer remains soluble in the solvent, dissolves and is removed, resulting in the desired pattern of openings.

8 Claims, No Drawings

METHOD OF PATTERNING STYRENE DIENE BLOCK COPOLYMER ELECTRON BEAM RESISTS

This application is a continuation-in-part of U.S. Ser. No. 412,930 filed Nov. 5, 1973, now abandoned.

BACKGROUND OF THE INVENTION

1. Field of the Invention

This invention relates to negative electron beam resists for photomask fabrication and for semiconductor device fabrication.

2. Description of the Prior Art

A resist is an adhering layer of a material with patterned openings on a support which is used as a mask for etching, either partially or completely through, the support exposed by the openings in the resist. The use of light as the irradiator or energy source for fabricating photoresists in the semiconductor art has been common for many years. The photoresist method of semiconductor manufacture was adequate until the advent of small geometry high frequency devices and integrated circuits requiring the formation of patterns with line widths in the neighborhood of 1 micron. Although 1 micron line openings, or resolution, can be obtained from photoresists in the laboratory, such line widths are not reproducible due to diffraction problems, with the practical limit of production produced openings being in the neighborhood of 5 to 6 microns in width.

The step from the use of light to electrons to form resists was a logical one. Theoretically, since the size of an electron is only 1/1000th the size of a quantum of light, an electron beam should produce openings with line widths 1/1000th the size of openings obtained with photoresists. However, due to electron bounce-back or back scatter from the surface supporting the resist, such small width openings are not obtainable, only 1000 A being the practical lower limit in size. Election beam microdefinition technology differs quite drastically from photoresist technology in that in photoresist technology, designers make large patterns out of a sheet of red plastic with the definition of the different elements of the pattern resulting from the cutting out of certain areas. The large plastic sheet is then photographed and reduced a number of times to bring the pattern down to the correct size so that the pattern can be transferred by light to the photoresist. In production, this procedure usually takes from one to two weeks from the design stage to the patterned resist.

In the case of electron beam technology, an electron beam is scanned across the resist itself to form the desired pattern. The electron beam is controlled by a computer which has been fed the coordinates of the pattern as previously determined by a designer. Thus, the use of the electron beam has eliminated all the time lost in preparing the reduction photography required to from a patterned photoresist. However, due to the pattern in the electron beam resist resulting from the scan of a very narrow electron beam, the reaction time of the resist to the electron beam is the time drawback to the production use of electron beam resists.

Obviously, then, in addition to the characteristics required of a good photoresist, such as: good adhesion to many materials, good etch resistance to conventional etches, solubility in desired solvents, and thermostability, an electron resist must react to the electron beam irradiation fast enough to allow a reasonable scan time of the electron beam. In order to bring electron beam technology into production status, resists composed of thin polymer films that are capable of retaining an image of one micron or less at very high scanning speeds of the electron beam are required.

A number of approaches have been taken in the past to develop practical electron beam resists. The first approach and one that proved to be the least successful was the use of convention photoresists, which are also polymers. Although capable of being exposed at relative high scan rates, such exhibit line widths, i.e., resolutions, greater than one micron in width.

The most widely used electron beam resist today is polymethyl methacrylate (PMMA), a positive resist. PMMA is characterized by excellent resolution and line width characteristics and by good processability. However, PMMA requires a relatively slow exposure rate, of approximately $5 \times 10^{-5}$ coulombs/cm$^2$, and has the inability to withstand strong oxidizing acids and base etches. A good electron beam resist must react at least ten times faster than PMMA and must withstand strong oxidizing acids and base etches.

A random copolymer of styrene-butadiene has also been proposed. See U.S. Pat. No. 3,794,510.

Therefore, an object of this invention is to provide a method of forming a negative electron beam resist which can be scanned by a beam of electrons at a rate greater than $5 \times 10^{-5}$ coulombs/cm$^2$.

Another object of this invention is to provide a method of forming a negative electron beam resist that can withstand strong oxidizing acids and base etches.

Another object of this invention is to provide a method of forming a negative electron beam resist having good adhesion to many support materials.

Another object of this invention is to provide a method of forming an improved styrene-diene negative electron beam resist.

Another object of this invention is to provide a method of forming a negative electron beam resist that is thermostable.

A further object of this invention is to provide a negative electron beam resist that can withstand strong oxidizing acids and base etches; has good adhesion to many support materials; and is soluble in many common solvents.

SUMMARY OF THE INVENTION

Briefly, the invention involves the use of a styrenediene block copolymer as a negative electron beam resist material (a negative resist being defined as one that cross links upon being irradiated thus becoming insoluble in many solvents while a positive resist is defined as one that is insoluble until irradiated when it degrades and becomes soluble). The copolymer is applied as a liquid to a support and allowed to dry to a thin film. An electron beam is caused to sweep or scan across the surface of the copolymer in the desired pattern to form a negative resist by imparting sufficient energy to break the double bonds of the diene groups. Cross linkage occurs in the diene groups and the styrene groups, thereby making the irradiated portion insoluble in certain solvents. After the electron beam scanning is completed, the resist is subjected to a solvent of the ketone class and the non-irradiated portion of the resist is removed, thereby leaving openings in the resist that correspond to the desired pattern.

Block copolymers are copolymers composed of two or more monomers that are not arranged randomly in the polymer. Block copolymers are like several minipolymers tied together. Styrene-butadiene block copolymers are blocks of styrene polymer tied to blocks of butadiene polymers. This arrangement allows this rubber to behave as a thermoplastic resin. For purposes of the present disclosure a block copolymer is defined as having at least three monomer units in each homopolymer block. The unique properties obtained by block copolymerization versus random copolymerization offer, as it turns out, several distinct advantages for the copolymer when used as an electron-beam resist.

The novel features believed characteristic of this invention are set forth in the appended claims. The invention itself, however, as well as other objects and advantages thereof, may best be understood by reference to the following detailed description.

DETAILED DESCRIPTION OF THE INVENTION

Dienes are double olefin groups and furnish the double bond reaction sites necessary for the cross linkage that results upon the copolymer being irradiated with an electron beam. The diene can be a butadiene

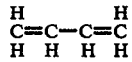

the specific example described herein, or can be any diene, such as styrene diene, where some or all of the hydrogen atoms of the butadiene are replaced by other atoms. Any diene with the number of carbon atoms between olefin groups between 0 and 3 forms an effective negative electron beam resist with styrene. The diene homopolymer could be used as the electron beam resist material itself since the requirement of the double bond reaction sites would be met. However, the dienes by themselves are very rubbery and too flexible to be used for a resist because the material will not retain its shape through the required processing steps.

However, this inventor has discovered that by block copolymerizing diene and styrene

an electron beam active monomer, an ideal electron beam resist material is obtained. Styrene by itself has a reaction time to electron beam irradiation which is 100 times slower than the styrene-butadiene block copolymer. Upon irradiation, added energy is introduced and the styrene is in an excited state. However, the benzene ring is extremely stable and will react only with difficulty.

In the pure styrene polymer, a styrene chain finds only other styrene chains to cross link with. However, when the copolymer of diene and styrene is irradiated with an electron beam the excited styrene molecules (the electron beam activated species) cross link with the diene molecules quite readily. Styrene diene block copolymers can be scanned with an electron beam at speeds much faster than PMMA. After cross linkage occurs, the styrene diene copolymer is insoluble in certain solvents, resulting in an excellent electron beam resist. A representative block copolymer covered by this invention is styrene-butadiene block copolymer.

A styrene-butadiene block copolymer can be purchased from Phillips 66 under the tradename Solprene with an average molecular weight ranging from 100,000 to 200,000. The reaction rate of the styrene diene copolymer is directly proportional to the molecular weight. A copolymer with a molecular weight of 120,000 has a reaction time one-half that of a copolymer having a molecular weight of 60,000. However, as the molecular weight of a copolymer is increased by increasing the chain linkage, the solubility of the copolymer decreases. The practical average molecular weight of styrene-dienes range from 10,000 to 500,000 with the reaction rate changing by a factor of 50 through that range.

Suitable block copolymers for use in the invention contain 15-85% by weight styrene, and preferably 25-40% by weight styrene.

The Solprene is purchased from Phillips 66 as a solid and is mixed with an aromatic solvent, such as xylene or toluene to form a 2% to 5% solution by weight, for example. The solution percentage is determined by the requirement of having as thin a film as possible to decrease the difficulties caused by the bounce-back of the electrons. The solid Solprene goes into solution very easily at room temperature with a minimum amount of stirring. However, as a precaution to remove any impurities, such as dust from the solution, the solution is filtered prior to being placed on the support.

While a method of forming a patterned electron beam resist will be described in order to form a mask on a chromium plate or support for subsequent use as a photoetch mask to etch semiconductor wafers, the method of this invention is also used for direct application of the resist to the semiconductor wafer with the chrome etch being replaced by a semiconductor etch.

The block copolymer solution is applied to the support and the chrome support with the covering copolymer is spun at a speed of approximately 3000 rpm, for example, in order to form a uniform layer of copolymer. The chrome support with the covering layer of copolymer is then baked in a nitrogen atmosphere at any temperature from room temperature to 75° C, with an optimum temperature of 45° C, for approximately 15 minutes to remove all of the solvent, leaving a dried thin film of from 1000 A to 6000 A in thickness.

The chrome substrate with the baked on copolymer is then placed in an electron irradiator and the electron beam allowed to scan the surface of the copolymer in a predetermined pattern as controlled by a computer. The styrene-butadiene, being a negative resist, will cross link in the portion of the copolymer subjected to the electron beam, which portion will become insoluble and will not be affected by the subsequent development with a solvent such as cyclohexanone. The copolymer is developed by spraying or dipping the copolymer covered chrome support in a cyclohexanone solution for approximately 30 seconds which will be a sufficient length of time to dissolve and remove the unirradiated portion of the copolymer leaving the desired pattern of openings in the resist. The cyclohexanone is removed by a rinse in isopropyl alcohol for 15 seconds, for example. To harden the cross linked copolymer pattern remaining on the chrome support, the copolymer covered support is baked at 120° C in air for 30 minutes which completes the copolymer resist, the final bake promoting further cross linkage.

Although not a part of this invention, the copolymer coated chrome support, with its completed resist, is finally subjected to a conventional chrome etch for a period of time sufficient to remove the chrome exposed by the openings in the patterned electron beam resist. Finally, the resist is removed by dipping the copolymer coated chrome support in diethylphthalate at 170° C for 60 minutes. The patterned chrome support is now ready to be used to form an image on a photoresist placed on a semiconductor wafer. The specific temperature and times previously furnished are not critical to the invention. Any pattern defining system can replace the use of a computer.

Although in the example given, the electron beam resist was used only to form a metal mask to be used for subsequent photoengraving, the same process steps are used when the electron beam resist is applied to a semiconductor wafer.

As a further example, two commercial styrene-butadiene copolymers were compared. They were both from the same manufacturer. The random copolymer (Solprene 1204) had a molecular weight of $359 \times 10^3$ and a styrene content of 26.6 percent. The block copolymer (Solprene 406) has a molecular weight of $83 \times 10^3$ and a styrene content of 25.6 percent. The random copolymer was twice as sensitive as the block copolymer, but based on the molecular weight differences (linear increase of sensitivity with molecular weight) the random copolymer should have been three times as fast. A block copolymer with half the molecular weight of the random copolymer gave the same speed. Thus showing the block polymers are basically more sensitive. In addition, the block-copolymer can retain 0.7 $\mu$ line and space separation over a 50% broader dose range than the random copolymer. This demonstrates a higher contrast for the block copolymer and manifests itself as better edges and less stringent process conditions. All tests were run under the same coating, exposure, and development conditions.

Because of the fast scanning rates that can be used due to the reaction rate of the styrene-butadiene block copolymer being forty times faster than PMMA, styrene-butadiene block copolymer electron beam resists compete quite favorably in cost with conventional photoresists. Obviously, since the chrome mask will subsequently be used for photoengraving of the semiconductor wafer the electron beam technology is not used to form very narrow width lines in the resist, although line widths of from 0.3 to 0.5 microns have been obtained with styrene-butadiene block copolymer resists.

The styrene-butadiene block copolymer resist has excellent adhesion to chrome, gold, silicon and silicon dioxide; excellent resistance to chrome, gold, silicon and silicon dioxide etches; is very soluble in the solvents given and has excellent thermostability. Any high energy irradiation, such as x-rays and alpha particles can be used to furnish the necessary energy to cause the cross linkage required.

Although, a specific embodiment of the invention has been described in detail, it is to be understood that various changes, substitutions and alterations can be made therein without departing from the spirit and the scope of the invention as defined by the appended claims.

What is claimed is:

1. The method of forming a patterned negative high energy beam resist, comprising the steps of:
   a. forming a thin film of a styrene-diene block copolymer on a support;
   b. scanning said thin film with a high energy beam in a predetermined pattern requiring resolutions of less than 1 micron at a speed of at least $5 \times 10^{-6}$ coulombs per cm$^2$ to cause the irradiated portion of said copolymer to cross link where irradiated by said high energy beam; and,
   c. dissolving the uncross linked portion of said copolymer with a solvent which dissolves and removes the uncross linked copolymer, thereby leaving said cross linked portion of said copolymer on said support with openings in a desired pattern.

2. The method of forming a patterned negative high energy beam resist, as defined in claim 1, wherein said copolymer is a styrene diene with the carbon atoms between olefin groups of the diene numbering between 0 to 3.

3. The method of forming a patterned negative high energy beam resist, as defined in claim 1, wherein said copolymer is styrene-butadiene.

4. The method of forming a patterned negative high energy beam resist, as defined in claim 1, wherein said copolymer is styrene diene.

5. The method of forming a patterned negative high energy beam resist, as defined in claim 3, wherein said high energy beam is an electron beam.

6. The method of forming a negative electron beam resist, comprising the steps of:
   a. mixing a styrene diene block copolymer having an average molecular weight of between 10,000 and 500,000 with sufficient aromatic solvent to produce a solution;
   b. placing said solution on a support;
   c. drying said solution to remove said solvent, thereby leaving a thin styrene-diene copolymer film on said support;
   d. scanning said thin film with an electron beam in a predetermined pattern requiring resolutions of at least 0.7 microns of at least $5 \times 10^{-6}$ coulombs/cm$^2$ to cause the irradiated portion of said copolymer to cross link where irradiated by said electron beam; and,
   e. dissolving the said uncross linked portion of said copolymer with a solvent which removes the uncross linked copolymer, thereby leaving said cross linked portion of said copolymer on said support, with openings in a desired pattern.

7. The method of forming a negative electron beam resist, as defined in claim 6, wherein said copolymer is styrene-butadiene block copolymer.

8. The method of forming a negative electron beam resist, as defined in claim 6, wherein said copolymer is styrene-diene block copolymer.

* * * * *